United States Patent [19]
Garza et al.

[11] Patent Number: 5,549,934
[45] Date of Patent: Aug. 27, 1996

[54] PROCESS OF CURING HYDROGEN SILSESQUIOXANE COATING TO FORM SILICON OXIDE LAYER

[75] Inventors: Mario Garza, Sunnyvale; Keith Chao, San Jose, both of Calif.

[73] Assignee: LSI Logic Corporation, Milpitas, Calif.

[21] Appl. No.: 462,651

[22] Filed: Jun. 5, 1995

Related U.S. Application Data

[62] Division of Ser. No. 245,191, May 17, 1994, Pat. No. 5,456,952.

[51] Int. Cl.$^6$ ..................................... C08J 7/18
[52] U.S. Cl. ................. 427/489; 427/573; 427/574; 427/226; 427/376.2; 427/387
[58] Field of Search .................... 427/489, 573, 427/574, 226, 376.2, 387

[56] References Cited

U.S. PATENT DOCUMENTS

| | | | |
|---|---|---|---|
| 4,096,315 | 6/1978 | Kubacki | 428/412 |
| 4,222,792 | 9/1980 | Lever et al. | 148/1.5 |
| 4,369,565 | 1/1983 | Muramatsu | 29/580 |
| 4,446,169 | 5/1984 | Castle et al. | 427/53.1 |
| 4,626,556 | 12/1986 | Nozue et al. | 522/99 |
| 4,981,530 | 1/1991 | Clodgo et al. | 148/33.3 |
| 5,043,789 | 8/1991 | Linde et al. | 357/52 |
| 5,059,448 | 10/1991 | Chandra et al. | 427/53.1 |
| 5,063,267 | 11/1991 | Hanneman et al. | 524/284 |
| 5,093,153 | 3/1992 | Brochot et al. | 427/41 |
| 5,114,754 | 5/1992 | Cronin et al. | 427/333 |
| 5,116,637 | 5/1992 | Baney et al. | 427/340 |
| 5,118,530 | 6/1992 | Hanneman et al. | 427/226 |
| 5,145,723 | 9/1992 | Ballance et al. | 427/397.7 |
| 5,148,247 | 9/1992 | Miura et al. | 357/23.6 |
| 5,152,834 | 10/1992 | Allman | 106/287.13 |
| 5,165,955 | 11/1992 | Gentle | 427/575 |
| 5,194,928 | 3/1993 | Cronin et al. | 257/629 |
| 5,236,861 | 8/1993 | Otsu | 437/67 |
| 5,320,868 | 6/1994 | Ballance et al. | 427/228 |
| 5,320,983 | 6/1994 | Ouellet | 437/231 |
| 5,356,828 | 10/1994 | Swan et al. | 437/67 |

FOREIGN PATENT DOCUMENTS 5-047921  2/1993  Japan ................. H01L 21/76

Primary Examiner—Benjamin Utech
Attorney, Agent, or Firm—John P. Taylor

[57] ABSTRACT

A process is disclosed for curing a hydrogen silsesquioxane coating material to form $SiO_2$ by first placing the coating material in a preheated furnace; igniting a plasma ignited in the furnace immediately after insertion of the coating material therein; then raising the temperature of the furnace up to a predetermined curing temperature, while still maintaining the plasma in the chamber; maintaining the coating material at the curing temperature until substantially all of the coating material has cured to form $SiO_2$; and then extinguishing the plasma and cooling the furnace. In another embodiment, the coating material is cured, with or without the assistance of heat and a plasma, in an ultrahigh vacuum, i.e., a vacuum of at least $10^{-5}$ Torr or better, and preferably at least $10^{-6}$ Torr or better.

15 Claims, 3 Drawing Sheets

```
┌─────────────────────────────────────────────┐
│ PROVIDING A SUBSTRATE HAVING A HYDROGEN     │
│ SILSESQUIOXANE COATING THEREON              │
└──────────────────────┬──────────────────────┘
                       │
┌──────────────────────┴──────────────────────┐
│ INSERTING THE COATED SUBSTRATE INTO A       │
│ FURNACE PREHEATED TO ABOUT 400°C AND        │
│ THEN IMMEDIATILY IGNITING A PLASMA IN THE   │
│ FURNACE                                     │
└──────────────────────┬──────────────────────┘
                       │
┌──────────────────────┴──────────────────────┐
│ MAINTAINING THE COATED SUBSTRATE IN THE     │
│ PREHEATED FURNACE FOR A PERIOD OF           │
│ ABOUT 20 MINUTES                            │
└──────────────────────┬──────────────────────┘
                       │
┌──────────────────────┴──────────────────────┐
│ THEN RAISING THE TEMPERATURE OF THE         │
│ FURNACE TO A CURING TEMPERATURE OF          │
│ ABOUT 700°C OVER A PERIOD OF                │
│ ABOUT 5 MINUTES                             │
└──────────────────────┬──────────────────────┘
                       │
┌──────────────────────┴──────────────────────┐
│ MAINTAINING THE FURNACE AND COATED          │
│ SUBSTRATE THEREIN AT THE CURING             │
│ TEMPERATURE FOR ABOUT 30 MINUTES            │
└──────────────────────┬──────────────────────┘
                       │
┌──────────────────────┴──────────────────────┐
│ EXTINGUISHING THE PLASMA AND COOLING        │
│ THE FURNACE AND COATED SUBSTRATE            │
│ BACK TO AT LEAST THE PREHEATED              │
│ TEMPERATURE OF ABOUT 400°C                  │
└──────────────────────┬──────────────────────┘
                       │
┌──────────────────────┴──────────────────────┐
│ REMOVING THE CURED COATED                   │
│ SUBSTRATE FROM THE FURNACE                  │
└─────────────────────────────────────────────┘
```

FIG. 2

```
┌─────────────────────────────────────────┐
│ PROVIDING A SUBSTRATE HAVING A HYDROGEN │
│ SILSESQUIOXANE COATING THEREON          │
└─────────────────────────────────────────┘
                    │
┌─────────────────────────────────────────┐
│ INSERTING THE COATED SUBSTRATE INTO A   │
│ HIGH VACUUM CHAMBER                     │
└─────────────────────────────────────────┘
                    │
┌─────────────────────────────────────────┐
│ EVACUATING THE HIGH VACUUM CHAMBER      │
│ DOWN TO A VACUUM OF A LEAST             │
│ $10^{-5}$ TORR                          │
└─────────────────────────────────────────┘
                    │
┌─────────────────────────────────────────┐
│ MAINTAINING THE COATED SUBSTRATE IN THE │
│ HIGH VACUUM CHAMBER TO PERMIT THE       │
│ HYDROGEN SILSESQUIOXANE TO CURE         │
│ TO $SiO_2$                              │
└─────────────────────────────────────────┘
                    │
┌─────────────────────────────────────────┐
│ REMOVING THE CURED COATED SUBSTRATE     │
│ FROM THE CHAMBER                        │
└─────────────────────────────────────────┘
```

FIG. 4

PROCESS OF CURING HYDROGEN SILSESQUIOXANE COATING TO FORM SILICON OXIDE LAYER

This application is a division of application Ser. No. 08/245,191, filed May 17, 1994, and now issued as U.S. Pat. No. 5,456,952, on Oct. 10, 1995.

BACKGROUND OF THE INVENTION

1. Field of the Invention

This invention relates to a process for forming a silicon oxide layer on an integrated circuit structure. More particularly, this invention relates to a process for forming a silicon oxide layer on an integrated circuit structure using a hydridosilane-based coating material, such as hydrogen silsesquioxane, as a source of silicon oxide.

2. Description of the Related Art

In the formation of integrated circuit structures, various conducting, semiconducting, and insulating materials are utilized. It is common to utilize $SiO_2$ as the insulation material, at least in part due to the ease of growing $SiO_2$ over exposed portions of either the silicon substrate or polysilicon materials present in the integrated circuit structure. $SiO_2$ is also formed on an integrated circuit structure by deposition techniques such as, for example, by chemical vapor deposition (CVD) processes.

However, there are certain applications such as, for example, planarization processes, where it is preferable to form a $SiO_2$ insulation layer by first applying a flowable coating material over the integrated circuit structure comprising a material which is a $SiO_2$ precursor. Very often such $SiO_2$ precursor coating materials are organic based materials. Such materials, when applied as coatings and then decomposed to form the desired $SiO_2$, sometimes also contain carbon residues. When a $SiO_2$ layer formed by decomposition of an organic precursor also contains carbon, subsequent exposure to other processing materials, such as an oxygen cleaning gas, can result in a reaction between the carbon and the processing material. For example, oxygen may react with the carbon in the coating to form a gas, thereby leaving behind a roughened surface on the oxide layer.

Because of this problem with carbon remaining in some $SiO_2$ coatings formed by decomposition of organic-based silica coating materials, the use of hydridosilane resins as coating material has been proposed. Hydridosilane resins, sometimes also referred to as hydrogen silsesquioxane or as "H-resin", have the formula $(H/SiO_{3/2})_n$, when fully condensed and hydrolyzed, where n is generally about 10–1000. Exemplary H-resins, when not fully hydrolyzed or condensed, may have the formula $HSi(OH)_x(OR)_yO_{z/2}$, in which $x=0-2$, $y=0-2$, $z=1-3$, $x+y+z=3$, and the average value of y over all of the units of the polymer is greater than 0. Each R is independently a 1–6 carbon organic group which, when bonded to silicon through the oxygen atom, forms a hydrolyzable substituent. Examples of R groups may include alkyls, aryls, and alkenyls. Such hydridosilanes or hydrogen silsesquioxanes (H-resins) silicon oxide precursors and their use as coating materials are more fully discussed and described in Ballance et at. U.S. Pat. No. 5,145,723, the disclosure of which is hereby incorporated by reference.

Hydridosilanes or hydrogen silsesquioxanes (H-resins) $SiO_2$ precursors as coating materials on integrated circuit structures have been found to flow well over the surfaces to be coated, including stepped surfaces, and provide a high yield of $SiO_2$, as well as providing an $SiO_2$ layer with a low carbon content. The coating material, after initial drying to remove the solvent used in applying the coating to the integrated circuit structure, is then cured to form the desired $SiO_2$ ceramic layer by heating it to a temperature of from about 200° C. up to as high as about 1000° C.

While the use of such hydridosilane or hydrogen silsesquioxane coating materials as precursors for the formation of $SiO_2$ layers on integrated circuit structure has, therefore, met with some success, it has not been without its problems. In this regard, incomplete curing of the material, i.e., incomplete conversion of the dried coating material to $SiO_2$, has been noted when the coating is applied over a stepped surface. In particular, when the coating is applied over closely spaced apart steps, or in a narrow trench, the coating material at the bottom of the trench does not completely cure. It has also been noted that even when the steps are spaced farther apart, the coating material in the bottom of the corner adjacent to the step does not completely cure.

These problems are illustrated in FIG. 1, wherein an integrated circuit structure is generally shown at 2 which includes closely spaced apart steps 10, 12, and 14 formed over a substrate 4, as well as steps 16 and 18 which are spaced farther apart. When an H-resin coating 20 is applied over integrated circuit structure 2 and dried, subsequent curing of the dried coating with heat alone results in the formation of $SiO_2$ adjacent the surface, as denoted at 22 in FIG. 1. However, region 24 between closely spaced apart steps 10, 12, and 14 and the furthest from the surface, does not completely cure. It is also noted that even when the steps are spaced further apart, as shown with steps 16 and 18 in FIG. 1, the regions shown at 26 adjacent the corners of steps 16 and 18 (and also on the respective outside corners of steps 10 and 14), also do not completely cure.

The curing of H-resin such as hydrogen silsesquioxane is a reversible reaction which can be represented by the following equation:

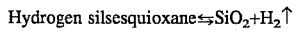

Thus, the completeness of the reaction to form the desired $SiO_2$ product depends upon the ability of the hydrogen gas to leave the coating material, thereby driving the above equation to the right, i.e., to complete formation of $SiO_2$. While it is not the intention to be bound by any theories of why the coating material does not completely cure, during prior art curing processes, it is thought that the coating material in the deepest portion of the trenches formed in the substrate or between closely spaced apart steps, as well as in the corners adjacent steps, has a reduced diffusion angle or reduced volume above the trapped hydrogen gas through which the hydrogen gas may pass, thus resulting in an incomplete curing of such portions of the coating material.

In any event, this failure to completely convert all of the hydrogen silsesquioxane coating material to $SiO_2$ can result in further release or emission of hydrogen gas from the coating during subsequent steps, including steps wherein the presence of a reducing gas such as hydrogen would not be desirable. Furthermore, such incomplete curing of the hydrogen silsesquioxane coating material results in the presence, on the integrated circuit structure, of material having a different coefficient of expansion, resulting in potential stresses; a different water content; and a material having different etch characteristics from the fully cured $SiO_2$.

The aforementioned Ballance et at. U.S. Pat. No. 5,145,723 discusses the curing of the dried hydrogen silsesquioxane coating material to form SiO$_2$ at a temperature ranging from about 20° C. to about 1000° C., preferably about 50° C. to about 800° C.; and suggests the use of reactive environments comprising air, O$_2$, oxygen plasma, ammonia, and amines. According to Ballance et at., the curing is preferably carried out under a wet ammonia atmosphere to hydrolyze the Si—H bonds and then under a dry ammonia atmosphere to effect removal of any remaining Si—OH groups.

Hanneman et at. U.S. Pat. No. 5,118,530 also teaches the curing of hydrogen silsesquioxane at temperatures ranging from about 20° C. to about 1000° C. The patentees state that the heating can be conducted at any effective atmospheric pressure from vacuum to super atmospheric and under any effective gaseous environment such as those comprising air, O$_2$, an inert gas such as nitrogen, ammonia, amines, etc., and further states that any method of heating such as the use of a convection oven, rapid thermal processing, or radiant or microwave energy is generally functional in the curing process. Hanneman et al. also prefer the use of a wet ammonia atmosphere to hydrolyze the Si—H bonds followed by a dry ammonia atmosphere to effect removal of any remaining Si—OH groups.

However, it has been found that even when using curing conditions, such as disclosed in the above-mentioned patents, complete curing of all of the coating material to form SiO$_2$ is less than satisfactory. It would, therefore, be highly desirable to provide a process for curing a hydrogen silsesquioxane coating material, previously applied to an integrated circuit, structure which will result in the conversion of substantially all of the coating material to SiO$_2$.

SUMMARY OF THE INVENTION

In accordance with one embodiment of the invention, a hydrogen silsesquioxane coating material is cured to form SiO$_2$ by first placing a substrate coated with the coating material in a preheated furnace and then igniting a plasma in the furnace as soon as the coated substrate is inserted into the furnace; then raising the temperature of the furnace up to a predetermined curing temperature, while still maintaining the plasma in the chamber; maintaining the coated substrate at the curing temperature until substantially all of the coating material has cured to form SiO$_2$; and then extinguishing the plasma and cooling the furnace. It has been found, in this regard, to be particularly important to raise the temperature of the furnace, and the coated substrate therein, up to the curing temperature while maintaining the plasma in the furnace. Failure to ignite the plasma until the furnace has reached the curing temperature may result in premature curing of the surface portions of the coating material on the coated substrate. In another embodiment, the coating material is cured, with or without the assistance of heat and a plasma, in an ultrahigh vacuum, i.e., a vacuum of at least $10^{-5}$ Torr or better, and preferably at least $10^{-6}$ Torr or better.

BRIEF DESCRIPTION OF THE DRAWINGS

FIG. 2 is a flow sheet of the preferred process of the invention.

FIG. 4 is a flowsheet of an alternative embodiment of the process of the invention.

DETAILED DESCRIPTION OF THE INVENTION

Figure 1:
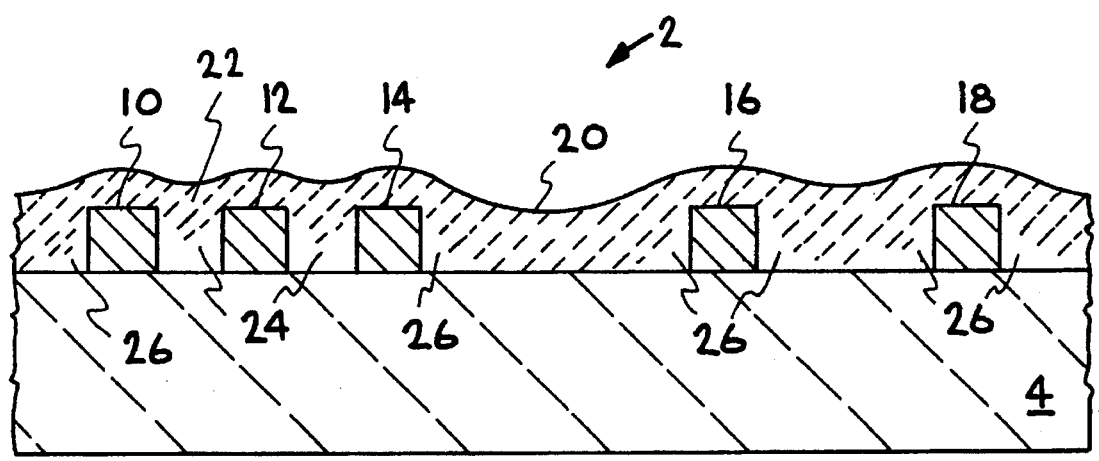
FIG. 1 is a fragmentary vertical cross-sectional view of a prior art stepped integrated circuit structure showing regions of respectively cured and uncured hydrogen silsesquioxane coating material over the stepped surface of the structure.

The invention comprises a process for curing a hydridosilane or hydrogen silsesquioxane (H-resin) coating material on a substrate which will result in the conversion of substantially all of the coating material to SiO$_2$. By use of the term "substantially all" is meant a conversion of at least 99 wt. % of the dried coating material to SiO$_2$. The coating material, hereinafter referred to as hydrogen silsesquioxane, may have the formula $(H/SiO_{3/2})_n$, when fully condensed and hydrolyzed, where n is generally about 10–1000. When the hydrogen silsesquioxane is not fully hydrolyzed or condensed, it may be represented by the formula $HSi(OH)_x(OR)_yO_{z/2}$, in which x=0–2, y=0–2, z=1–3, x+y+z=3, the average value of y over all of the units of the polymer is greater than 0, and each R may comprise the same or different 1–6 carbon organic group and which, when bonded to silicon through the oxygen atom, will form a hydrolyzable substituent.

The hydrogen silsesquioxane coating material may be initially dissolved in a solvent, applied to the surface of the substrate, such as an integrated circuit structure (which may be conventionally formed on a semiconductor wafer) by any conventional application technique such as spinning the coating onto the substrate, and then dried to remove the solvent by placing the coated substrate on a hot plate. The result is a dried coating of hydrogen silsesquioxane on the surface of the substrate, e.g., on the surface of an integrated circuit structure formed on a semiconductor wafer. This portion of the coating process is considered to be conventional and forms no part of the invention.

At this point, in accordance with the invention, the coated substrate is placed in a preheated chamber or furnace, which preferably is a preheated furnace maintained at a temperature of at least about 300° C. up to about 400° C. The curing furnace is maintained at a vacuum of 1 Torr or less, in accordance with this embodiment of the invention, during the curing process. One or more gases are flowed into the furnace, during the curing process, at a rate equivalent to the flow of from about 500 to about 2000 standard cubic centimeters per second (sccm) into a 75 liter volume furnace. The gas flowed into the chamber is preferably a nitrogen-containing gas, such as nitrogen, although oxygen may also be used in the furnace. The importance of this gas flow is to ensure a constant density of plasma in the furnace during the curing.

If the furnace is already preheated at a temperature of 400° C., the furnace, with the coated wafer therein, is maintained at this temperature for at least about 5 minutes, preferably about 10 minutes, and most preferably from about 15 to about 20 minutes, to ensure that the coated substrate reaches this temperature prior to raising the temperature of the furnace further.

If the furnace is not already preheated to 400° C. prior to insertion of the coated substrate, the temperature of the furnace, after insertion of the substrate, is gradually raised, over a period of 2–3 minutes, up to 400° C., and then maintained at this temperature an additional time period of at least about 5 minutes, preferably about 10 minutes, and most preferably from about 15 to about 20 minutes, to ensure that the substrate reaches a temperature of 400° C. prior to raising the temperature of the furnace further. It should be noted that the total time period of the coated substrate in the furnace will be about the same regardless of whether or not the furnace was already preheated to 400° C., to ensure that in either case, the coated wafer will have reached a temperature of 400° C. prior to further heating of the furnace to a hotter temperature.

In either event, in accordance with the invention, a plasma is ignited in the furnace immediately after insertion of the hydrogen silsesquioxane-coated substrate into the furnace. The plasma is maintained at a power level of from about 25 to 2000 watts, preferably about 100 to about 1200 watts. While the power may be constantly maintained, preferably a duty cycle is maintained of from about 40% to about 90%, preferably from about 50% to about 70%, and typically about 60%, e.g., on about 36 seconds and then off about 24 seconds, to prevent exhaustion of the ionizable molecules and to provide a more uniform plasma energy. The plasma may be energized from a conventional RF power source, i.e., a power source operating within a frequency range of from about 3 megaHertz to 3,000 megahertz (wavelengths of from 10 centimeters (cm.) to 100 meters), or a microwave power source, i.e., a power source operating within a frequency range of from about 3,000 megaHertz to 30,000 megattertz (wavelengths of from 1 cm. to 10 cm.).

It should be noted that it is very important that the plasma be ignited immediately after insertion of the coated substrate into the curing furnace. While we do not wish to be bound by any theories of operation, it is believed that the absence of plasma during the initial stages of the cure may result in premature curing of the outer portions or surface of the coating material prior to curing of the inner portions of the coating, thus, in effect, possibly forming a skin on the coating layer, which may trap hydrogen subsequently released as the inner portions of the coating material furthest from the surface subsequently cure and release hydrogen.

After insertion of the hydrogen silsesquioxane-coated substrate into the furnace and bringing up the temperature of the coated substrate to about 400° C. for the time period previously discussed, the furnace temperature may be further raised, if desired, to further accelerate the curing time of the coating. It should be noted in this regard, however, that if aluminum or other low melting temperature metals are already present beneath the coating, i.e., the $SiO_2$ insulation layer is being formed over an aluminum metal layer, the curing temperature used should not be as high as the melting temperature of the underlying metal, e.g., 440° C. for aluminum, and preferably should not exceed about 400° C.

If it is not desired to further raise the temperature of the furnace, for example, because of the presence of aluminum or other low melting materials, the coated substrate should be maintained in the furnace at the 400° C. temperature for a curing time period of at least 30 minutes, preferably at least 40 minutes, after which the heat to the furnace may be shut off and the plasma extinguished. It should be noted that when the curing temperature does not exceed about 400° C., for example because of the presence of an underlying metal layer, the curing time period may be extended, if need be, for as much time as is economically feasible. After the plasma and the heat to the furnace are shut off, the coated substrate may be removed from the furnace, or allowed to cool and then removed. The temperature at which the coated substrate is removed from the furnace may depend upon the type of materials used to convey the coated substrate into and out of the heated furnace, and the susceptibility of such materials to oxidation if exposed to ambient at elevated temperatures.

If there are no materials present in the integrated circuit structure which would inhibit the use of a higher temperature for the curing period, the temperature in the furnace is preferably raised to a curing temperature of at least about 600° C., and more preferably to a curing temperature of at least about 700° C., over a period of from about 5 minutes to about 30 minutes. The coated structure is then maintained at this temperature for a period of at least about 20 minutes, preferably at least about 30 minutes, following which the furnace temperature is reduced back to about 400° C. and the plasma is extinguished. Longer time periods may be utilized for the elevated temperature curing, but are not deemed to be needed and, therefore, not believed to be economically justifiable. The substrate is then allowed to remain in the furnace for an additional period of from about 10 to 20 minutes to allow the wafer to cool down to the furnace temperature of about 400° C. following which the $SiO_2$-coated substrate may be removed from the furnace for further processing, or allowed to further cool.

Figure 3:
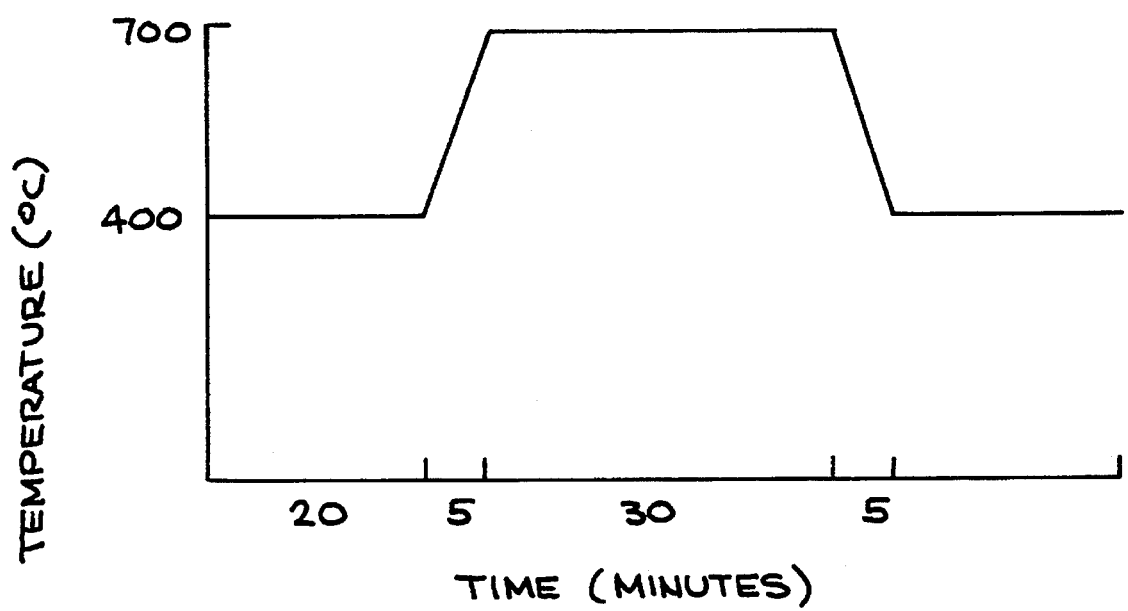
FIG. 3 is a graph plotting time versus temperature for a curing cycle used in accordance with a preferred embodiment of the invention to convert substantially all of the hydrogen silsesquioxane coating material to SiO$_2$.

The preferred mode of operating the curing process of the invention is to preheat the furnace up to about 400° C. prior to insertion of the coated substrate into the furnace. This is shown in the graph of FIG. 3, which shows the time period for the initial heating at 400° C. On the presence of plasma) of up to about 20 minutes, the 5 minute temperature ramp up to the preferred 700° C. curing temperature, the curing temperature time period of up to about 30 minutes, and then (following extinguishment of the plasma), the 5 minute cooling down of the furnace to the preheat temperature of 400° C.

When hydrogen silsesquioxane coatings, previously applied to a substrate and dried, are cured by heating at 400° C. in a plasma for a period of at least 5 minutes, and then heated to 700° C. over a period of about 5 minutes, and then maintained at 700° C. for a period of about 30 minutes, followed by shut off of the plasma and the furnace to allow the coated substrate to cool until it reaches a temperature of about 400° C., preferably 200° C., the curing process of the invention can result in the curing and conversions of at least about 99 wt. % of the hydrogen silsesquioxane coating material to $SiO_2$.

It should be noted in this regard, that the practice of the process of the invention permits the formation of thicker coatings of hydrogen silsesquioxane on the substrate prior to the curing step. For example, in the prior art practice, it was customary to limit the initial thickness of the hydrogen silsesquioxane coating to 7000 Angstroms or less, because greater thicknesses were found to cause cracking of the coating as it was cured. However, using the process of the invention for the curing of the hydrogen silsesquioxane coatings, coating thicknesses of as much as 14,000 Angstroms (1.4 micrometers) of hydrogen silsesquioxane may be formed on a substrate, and then cured, using the curing process of the invention, without the formation of cracks in the coating.

It should also be noted that using the curing process of the invention for the curing of a hydrogen silsesquioxane coating over a lower layer of conventionally deposited $SiO_2$, i.e., CVD formed $SiO_2$ permits the formation of a much thinner CVD oxide layer beneath the hydrogen silsesquioxane layer, i.e. a decrease down to as small as about 500 Angstroms, since it is now not necessary to provide thick CVD oxide coatings to protect underlying active devices from release of hydrogen (during operation of the devices) from an overlying partially cured hydrogen silsesquioxane layer.

In another embodiment of the invention, the coated substrate, after drying of the coating to remove solvent, may be placed in a high vacuum chamber, i.e., a chamber capable of providing a vacuum of at least about $10^{-5}$ Torr or better, and preferably at least $10^{-6}$ Torr or better, to as low as about $10^{-9}$ Torr or better. The coated wafer is maintained in this high vacuum chamber for a period of at least about 5 minutes. The use of the previously described heating temperatures, and in some instances even the plasma, may optionally be carded out while maintaining the coated substrate in the high vacuum chamber. The presence of hydrogen in the outgas may also be monitored for an end point, by determining when the hydrogen content of the outgas drops below a predetermined point, indicative that substantially all of the hydrogen silsesquioxane has been converted to $SiO_2$ in the high vacuum chamber and that no more hydrogen is consequentially being liberated by the reaction of the hydrogen silsesquioxane.

Thus, the curing process of the invention, in either embodiment, permits a more complete or thorough curing or conversion of the hydrogen silsesquioxane coating material to $SiO_2$, resulting in a more homogeneous formation of $SiO_2$ as well as permitting the formation of a thicker $SiO_2$ layer from a thicker hydrogen silsesquioxane coating layer without cracking of the coating material during the conversion.

Having thus described the invention what is claimed is:

1. A process for converting substantially all of a hydrogen silsesquioxane coating material on a substrate to $SiO_2$ which comprises:
   a) placing said substrate coated with said hydrogen silsesquioxane coating material in a vacuum chamber; and
   b) maintaining said vacuum chamber at a vacuum of at least $10^{-5}$ Torr, until substantially all of said hydrogen silsesquioxane coating material has been converted to $SiO_2$.

2. The process of claim 1 wherein said vacuum in said vacuum chamber is maintained at a level of from about $10^{-5}$ Torr to about $10^{-9}$ Torr until substantially all of said hydrogen silsesquioxane coating material has been converted to $SiO_2$.

3. The process of claim 2 wherein said coated substrate is maintained in said vacuum chamber for a period of at least about 5 minutes to convert all of said hydrogen silsesquioxane coating material to $SiO_2$.

4. The process of claim 2 which further includes heating said coated substrate in said vacuum chamber to a temperature of at least about 400° C. while maintaining said vacuum in said vacuum chamber.

5. The process of claim 2 which further includes igniting a plasma in said vacuum chamber while maintaining said vacuum in said vacuum chamber.

6. The process of claim 2 which further includes heating said coated substrate in said vacuum chamber to a temperature of at least about 400° C. and igniting a plasma in said vacuum chamber while maintaining said vacuum in said vacuum chamber.

7. A process for converting substantially all of a hydrogen silsesquioxane coating material on a substrate to $SiO_2$ which comprises:
   a) placing said substrate coated with said hydrogen silsesquioxane coating material in a vacuum chamber; and
   b) maintaining said vacuum chamber at a vacuum of from about $10^{-6}$ Torr to about $10^{-9}$ Torr, until substantially all of said hydrogen silsesquioxane coating material has been converted to $SiO_2$.

8. The process of claim 7 which further includes monitoring the outgas from said vacuum chamber for hydrogen to determine when all of said hydrogen silsesquioxane has been converted to $SiO_2$.

9. The process of claim 7 wherein said coated substrate is maintained in said vacuum chamber for a period of at least about 5 minutes to convert all of said hydrogen silsesquioxane coating material to $SiO_2$.

10. The process of claim 7 which further includes heating said coated substrate in said vacuum chamber to a temperature of at least about 400° C. while maintaining said vacuum in said vacuum chamber.

11. The process of claim 7 which further includes igniting a plasma in said vacuum chamber while maintaining said vacuum in said vacuum chamber.

12. A process for converting substantially all of a hydrogen silsequioxane coating material on a substrate to $SiO_2$ which comprises:
   a) placing said substrate coated with said hydrogen silsesquioxane coating material in a vacuum chamber;
   b) maintaining said vacuum chamber at a vacuum of from $10^{-5}$ Torr to about $10^{-9}$ Torr; and
   c) monitoring the outgas from said vacuum chamber for hydrogen to determine when all of said hydrogen silsequioxane has been converted to $SiO_2$.

13. The process of claim 12 wherein said coated substrate is maintained in said vacuum chamber for a period of at least about 5 minutes to convert all of said hydrogen silsesquioxane coating material to $SiO_2$.

14. The process of claim 12 which further includes heating said coated substrate in said vacuum chamber to a temperature of at least about 400° C. while maintaining said vacuum in said vacuum chamber.

15. The process of claim 12 which further includes heating igniting a plasma in said vacuum chamber while maintaining said vacuum in said vacuum chamber.

\* \* \* \* \*

UNITED STATES PATENT AND TRADEMARK OFFICE
CERTIFICATE OF CORRECTION

PATENT NO. : 5,549,934

DATED : August 27, 1996

INVENTOR(S) : Mario Garza and Keith Chao

It is certified that error appears in the above-identified patent and that said Letters Patent is hereby corrected as shown below:

Title Page:

Drawing: Line 6 (box 3), change "OF A LEAST" to "OF AT LEAST".

Sheet 3 of 3 of Drawings (Figure 4), line 6 (box 3), change "OF A LEAST" to "OF AT LEAST".

Col. 8, line 29, claim 12, change "silsequioxane" to "silsesquioxane".

Col. 8, line 37, claim 12, change "silsequioxane" to "silsesquioxane".

Col. 8, line 47, claim 15, omit "heating".

Signed and Sealed this

Seventeenth Day of December, 1996

Attest:

BRUCE LEHMAN

*Attesting Officer*   *Commissioner of Patents and Trademarks*